United States Patent
Jung et al.

(10) Patent No.: US 9,105,861 B2
(45) Date of Patent: Aug. 11, 2015

(54) LIGHT EMITTING DEVICE AND ORGANIC LIGHT EMITTING DISPLAY DEVICE INCLUDING THE SAME

(71) Applicant: LG Display Co., Ltd., Seoul (KR)

(72) Inventors: Young-Kwan Jung, Daegu (KR); Tae-Il Kum, Gyeonggi-do (KR); Hye-Seung Kang, Gyeonggi-do (KR); Hyung-June Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/061,939

(22) Filed: Oct. 24, 2013

(65) Prior Publication Data

US 2014/0117337 A1      May 1, 2014

(30) Foreign Application Priority Data

Oct. 31, 2012  (KR) .................. 10-2012-0122741
Jul. 29, 2013  (KR) .................. 10-2013-0089382

(51) Int. Cl.
*H01L 51/50*      (2006.01)
*H01L 51/00*      (2006.01)

(52) U.S. Cl.
CPC ........ *H01L 51/5072* (2013.01); *H01L 51/5044* (2013.01); *H01L 51/0067* (2013.01); *H01L 51/0072* (2013.01); *H01L 51/508* (2013.01); *H01L 2251/5346* (2013.01)

(58) Field of Classification Search
CPC .......................... H01L 51/5072; H01L 51/508
USPC ............................................... 257/13, 79, 94
See application file for complete search history.

(56) References Cited

U.S. PATENT DOCUMENTS

| | | | |
|---|---|---|---|
| 7,868,541 B2 * | 1/2011 | Park et al. .................. 313/504 |
| 8,476,624 B1 * | 7/2013 | Wu et al. .................... 257/40 |
| 8,482,017 B2 * | 7/2013 | Lee et al. .................... 257/96 |
| 8,658,832 B2 * | 2/2014 | Yersin et al. .................. 568/2 |
| 8,686,139 B2 * | 4/2014 | Lux et al. ................... 544/251 |
| 8,829,497 B2 * | 9/2014 | Kijima ....................... 257/40 |
| 2010/0288362 A1 * | 11/2010 | Hatwar et al. ............... 136/263 |
| 2011/0215308 A1 * | 9/2011 | Im et al. ..................... 257/40 |
| 2012/0097998 A1 * | 4/2012 | Pieh et al. ................... 257/89 |
| 2012/0098011 A1 * | 4/2012 | Choi et al. .................. 257/98 |
| 2012/0098012 A1 * | 4/2012 | Kim et al. ................... 257/98 |
| 2012/0241794 A1 | 9/2012 | Seo et al. |

(Continued)

FOREIGN PATENT DOCUMENTS

EP          2045847 A2     4/2009

OTHER PUBLICATIONS

Search and Examination Report issued in counterpart Great Britain Patent Application No. 1318547.5 dated Mar. 18, 2014.

*Primary Examiner* — Ida M Soward
(74) *Attorney, Agent, or Firm* — Morgan,Lewis & Bockius LLP

(57) ABSTRACT

A light emitting device includes first and second electrodes facing each other on a substrate, a plurality of stacks stacked between the first and second electrodes and each including an EML so as to emit particular light, and a charge generation layer formed between the stacks so as to adjust charge balance therebetween and including an N-type charge generation layer and a P-type charge generation layer, wherein at least any one of the N-type charge generation layer and the P-type charge generation layer includes the same electron transporting material as that of an electron transport layer of one of the stacks that is adjacent to the N-type charge generation layer.

7 Claims, 11 Drawing Sheets

(56) References Cited

U.S. PATENT DOCUMENTS

2014/0008629 A1* 1/2014 Tsuji et al. ..................... 257/40
2014/0084269 A1* 3/2014 Weaver et al. .................. 257/40
2014/0246663 A1* 9/2014 Kambe et al. ................... 257/40

* cited by examiner

●:carrier

●:carrier

● : Electron carrier
○ : Hole carrier

LIGHT EMITTING DEVICE AND ORGANIC LIGHT EMITTING DISPLAY DEVICE INCLUDING THE SAME This application claims the benefit of Korean Patent Applications No. 10-2012-0122741, filed on Oct. 31, 2012 and No. 10-2013-0089382, filed on Jul. 29, 2013, which is hereby incorporated by reference as if fully set forth herein.

BACKGROUND OF THE INVENTION

1. Field of the Invention

The present invention relates to a light emitting device and an organic light emitting display device including the same, and more particularly, to a light emitting device having a decreased number of hetero-junction interfaces through forming some layers using the same material and thus has reduced driving voltage and an organic light emitting display device including the same.

2. Discussion of the Related Art

Image display devices, which display a variety of information on a screen, are a core technology of information and communication and are becoming increasingly thinner, lighter, more portable, and higher in performance. Thus, organic light emitting display devices, which display an image by controlling light emission of an organic emission layer (EML), have received attention as a flat panel display device that may address problems in terms of weight and volume which occur in cathode ray tubes (CRTs). Such organic light emitting display devices do not require separate light sources and are considered a competitive application for compact device fabrication and clear display of colors.

In this regard, organic light emitting display devices are self-emissive devices including a thin EML between electrodes and can be fabricated as a thin film with a thickness similar to that of paper. In particular, an organic light emitting diode includes an anode, a hole injection layer (HIL), a hole transport layer (HTL), an EML, an electron injection layer (EIL), an electron transport layer (ETL), and a cathode.

As such, an organic light emitting display device has a single stack structure. In addition, organic light emitting display devices having a multi-stack structure including a plurality of stacks have been developed.

Such organic light emitting display devices having a multi-stack structure include an anode, a cathode, and a first stack, a charge generation layer, and a second stack that are sequentially stacked between the anode and the cathode.

In this regard, the first stack includes a HTL, an EML, and an ETL that are formed on the anode, and the second stack includes a HTL, an EML, and an ETL.

The charge generation layer is disposed between the first and second stacks to control charge balance of the first and second stacks and includes an n-type charge generation layer and a p-type charge generation layer.

As illustrated in FIG. 1, such organic light emitting display devices having a multi-stack structure have higher driving voltages than those of organic light emitting display devices having a single stack structure and, accordingly, power consumption is increased. FIG. 1 is a graph showing comparison results between driving voltages of organic light emitting display devices respectively having a single stack structure and a multi-stack structure. In FIG. 1, a first graph 20 shows the driving voltage of an organic light emitting device having a single stack structure, and a second graph 22 shows the driving voltage of an organic light emitting device having a structure including first and second stacks. As illustrated in FIG. 1, the driving voltage shown in the second graph 22 is considerably higher than that shown in the first graph 20.

This is because charge trapping occurs at an interface between hetero-organic materials and thus driving voltage is increased due to the charge trapping. Thus, an organic light emitting device having a multi-stack structure has a greater number of stacked organic materials than that of an organic light emitting device having a single stack structure and, accordingly, has an increasing number of junction interfaces between hetero-organic materials, which results in occurrence of charge trapping and thus increased driving voltage.

Therefore, there is a need to develop an organic light emitting display device having a multi-stack structure that has a decreased number of hetero-junction interfaces.

SUMMARY OF THE INVENTION

Accordingly, the present invention is directed to a light emitting device and an organic light emitting display device including the same that substantially obviate one or more problems due to limitations and disadvantages of the related art.

An object of the present invention is to provide a light emitting device having a decreased number of hetero-junction interfaces through forming some layers using the same material and thus has reduced driving voltage and an organic light emitting display device including the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device includes first and second electrodes facing each other on a substrate, a plurality of stacks stacked between the first and second electrodes and each comprising an EML so as to emit particular light, and a charge generation layer formed between the stacks so as to adjust charge balance therebetween and comprising an N-type charge generation layer and a P-type charge generation layer, wherein at least any one of the N-type charge generation layer and the P-type charge generation layer comprises the same electron transporting material as that of an electron transport layer of one of the stacks that is adjacent to the N-type charge generation layer.

The P-type charge generation layer may include about 5 to about 40% of the same electron transporting material as that of the electron transport layer.

The N-type charge generation layer may include an alkali metal or an alkali earth metal and the same electron transporting material as that of the electron transport layer.

The N-type charge generation layer may include an alkali metal or an alkali earth metal and the same electron transporting material as that of the electron transport layer, and the P-type charge generation layer may include about 5% to about 40% of the same electron transporting material as that of the electron transport layer.

The alkali metal or alkali earth metal may be doped in a partial area or entire area of the N-type charge generation layer at a concentration of 1% to 10% based on a volume of the N-type charge generation layer.

The partial area or entire area of the N-type charge generation layer may have a doping concentration gradient of the alkali metal or alkali earth metal.

When the partial area or entire area of the N-type charge generation layer is doped with the alkali metal or alkali earth metal, a doping concentration of the alkali metal or alkali earth metal may increase towards the P-type charge generation layer.

In another aspect of the present invention, an organic light emitting display device includes the light emitting device described above, a driving thin film transistor formed on the substrate so as to be connected to the first electrode of the light emitting device, and a bank insulating film with bank holes to expose the first electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
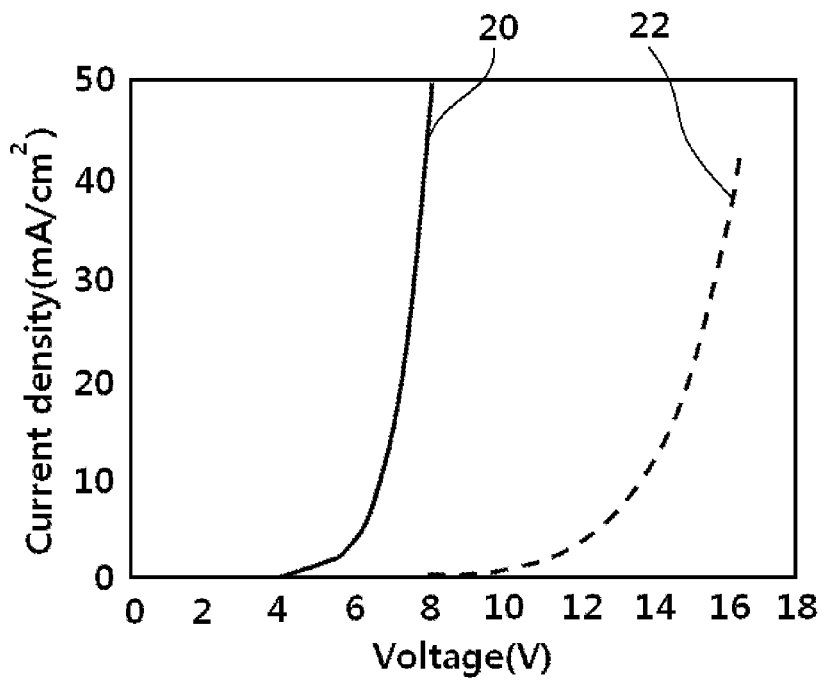
FIG. 1 is a graph showing comparison results between driving voltages of organic light emitting display devices respectively having a single stack structure and a multi-stack structure.

Hereinafter, embodiments will be described with reference to the annexed drawings. Features and operating effects of embodiments will be clearly understood from the following description of specific embodiments. The same reference numerals will be used throughout the drawings to refer to the same elements. When a detailed description of the related art may unnecessarily obscure the subject matter of the present invention, a description thereof will be omitted.

Exemplary embodiments of the present invention will now be described in detail with reference to FIGS. 2 to 12.

An organic light emitting diode (OLED) according to an embodiment of the present invention has a multi-stack structure including first and second electrodes facing each other on a substrate, a plurality of stacks disposed between the first and second electrodes and each including an emitting layer (EML) to emit particular light, and a charge generation layer (CGL) formed between the stacks to control charge balance therebetween. The stacks included in the OLED having a multi-stack structure may each include an EML of the same color or respectively include EMLs of different colors. The OLED having a multi-stack structure including stacks respectively including EMLs of different colors may realize white light through mixing of light emitted from the EML of each stack.

In this regard, the OLED having a multi-stack structure according to the present invention includes a first stack, a CGL, and a second stack. A case in which each stack includes an EML of a different color will now be described by way of example.

Figure 2:
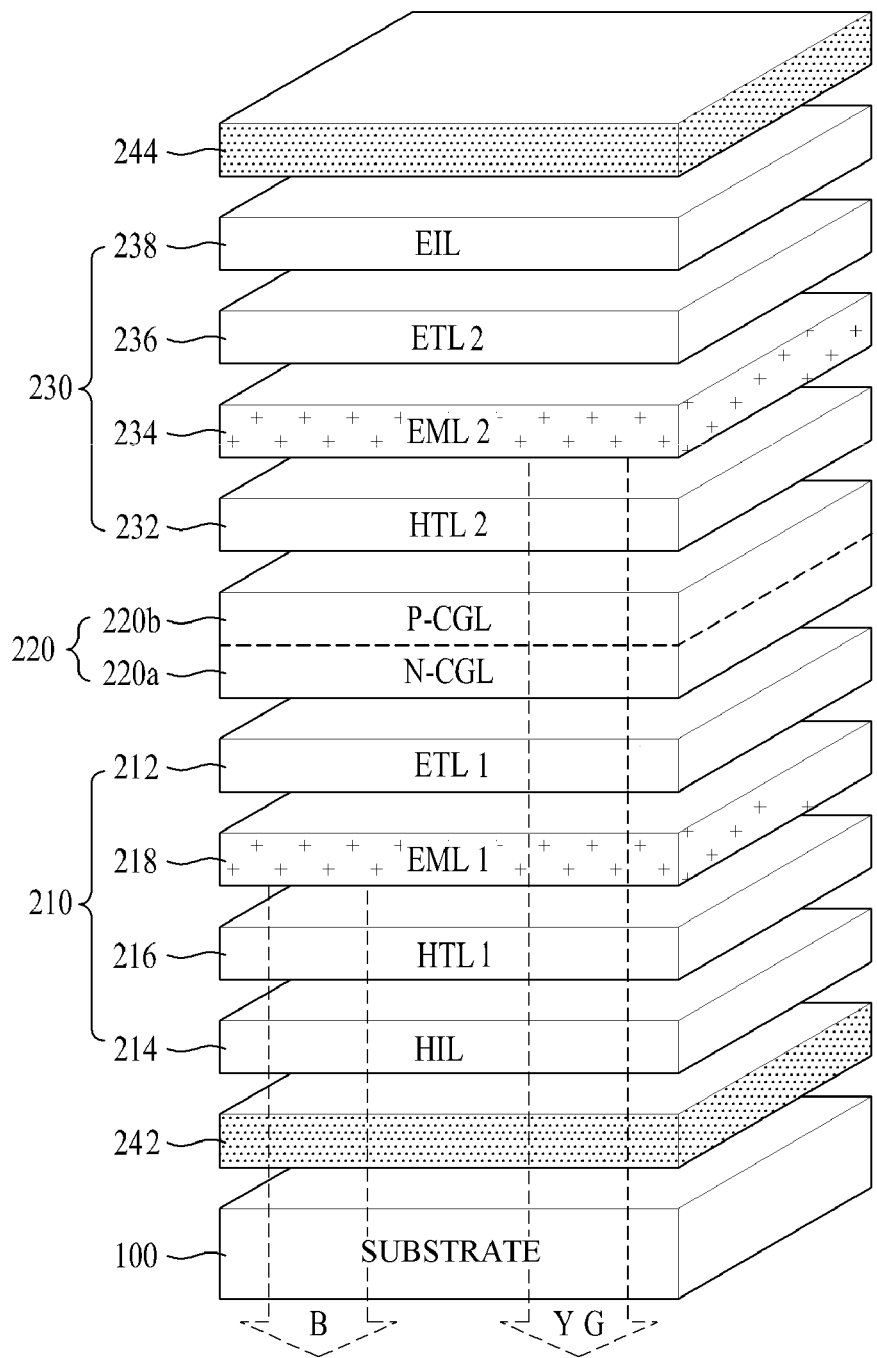
FIG. 2 is a view illustrating an organic light emitting display device according to a first embodiment of the present invention.

Referring to FIG. 2, the OLED according to a first embodiment of the present invention has a multi-stack structure including first and second electrodes 242 and 244 facing each other on a substrate 100, and a first stack 210, a CGL 220, and a second stack 230 that are stacked between the first and second electrodes 242 and 244. In the OLED having such multi-stack structure, each stack includes an EML of a different color and light emitted from the EML of each stack is mixed to realize white light. The OLED according to an embodiment of the present invention realizes white light through mixing of blue light emitted from a first EML 218 and yellow-green light emitted from a second EML 234. In this regard, white light is generated through mixing of light emitted from each stack and thus the light emitted from the first and second EMLs 218 and 234 is not limited to blue light and yellow-green light. In addition, although FIG. 2 illustrates a bottom emission type OLED in which light emitted from the first and second EMLs 218 and 234 is emitted in a bottom direction, the OLEDs according to embodiments of the present invention are not limited to the above example and may be of a top emission type or a dual emission type.

The first electrode 242 as an anode is formed of a transparent conductive material such as a transparent conductive oxide (TCO), e.g., indium tin oxide (ITO), indium zinc oxide (IZO), or the like.

The second electrode 244 as a cathode is formed of a reflective metal material such as aluminum (Al), gold (Au), molybdenum (Mo), chromium (Cr), copper (Cu), LiF, an Al—LiF alloy, or the like.

The first stack 210 includes a hole injection layer (HIL) 214, a first hole transport layer (HTL1) 216, a first emitting layer (EML1) 218, and a first electron transport layer (ETL1) 212 that are sequentially stacked between the first electrode 242 and the CGL 220. In this regard, the EML1 218 includes a fluorescent blue dopant and host to emit blue light. In addition, at least one HTL may be further included between the HTL1 216 and the EML1 218.

The second stack 230 includes a second HTL (HTL2) 232, a second EML (EML2) 234, a second ETL (ETL2) 236, and an electron injection layer (EIL) 238 that are sequentially stacked between the second electrode 244 and the CGL 220. In this regard, the EML2 234 includes a phosphorescent yellow-green dopant and host to emit yellow-green light. In addition, at least one HTL may be further included between the HTL2 232 and the EML2 234.

The CGL 220 is formed between the first and second stacks 210 and 230 to adjust charge balance therebetween. The CGL 220 includes a P-type CGL (P-CGL) 220b disposed adjacent to the second stack 220 to generate and inject electrons and holes and an N-type CGL (N-CGL) 220a formed adjacent to the EML1 218 of the first stack 210 to inject and transport electrons.

The P-CGL 220b generates holes and electrons, injects the generated holes into the HTL2 232 of the adjacent second stack 230, and injects the generated electrons into the N-CGL 220a.

The N-CGL 220a is formed between the P-CGL 220b and the EML1 218 and injects and transports electrons injected from the P-CGL 220b into the EML1 218. For this operation, the N-CGL 220a includes an organic compound, the same electron transporting material as that of the ETL1 212, and a metal.

The organic compound has a fused aromatic ring with 15 to 40 carbon atoms, a substituent of which has at least one selected from among N, S, and O. In particular, the organic compound has a lowest unoccupied molecular orbital (LUMO) energy level of −2.0 eV or less and a bandgap of 2.5 eV or more. Preferably, the organic compound has a LUMO energy level between −3.0 and −2.0 eV and a bandgap between 2.5 and 3.5 eV.

As the metal, an alkali metal or an alkali earth metal is used.

The electron transporting material includes at least one nitrogen atom (N) and is formed of an organic compound having a heterocyclic ring with 5 to 30 carbon atoms. In particular, the electron transporting material has a LUMO energy level of −2.0 eV or less and a bandgap of 2.5 eV or more. Preferably, the electron transporting material has a LUMO energy level between −3.0 and −2.0 eV and a bandgap between 2.5 and 3.5 eV.

Since the N-CGL 220a includes the electron transporting material, the ETL1 212 formed of the electron transporting material and the N-CGL 220a including the electron transporting material form a homo-junction. Accordingly, due to reduction in the number of hetero-junction interfaces, possibility of charge trapping at interfaces between hetero-junctions is minimized and thus an OLED according to a first embodiment of the present invention may have decreased driving voltage and, accordingly, reduced power consumption.

Figure 3A:
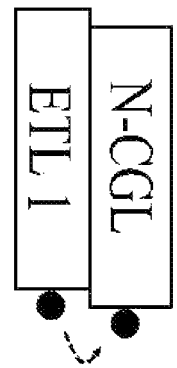
FIG. 3A is a diagram for explaining charge movement between a first electron transport layer and an N-type charge generation layer of a conventional organic light emitting display device.

In particular, a conventional OLED having a multi-stack structure includes an N-type CGL and a first ETL that are formed of different materials, and thus, the N-type CGL and the first ETL form a hetero-junction as illustrated in FIG. 3A. Due to such an interface between different hetero-junctions, an energy barrier is generated. In this regard, charges are accumulated at the energy barrier, and charge trapping in which even other charges cannot move due to the charges accumulated at the interface occurs.

Figure 3B:
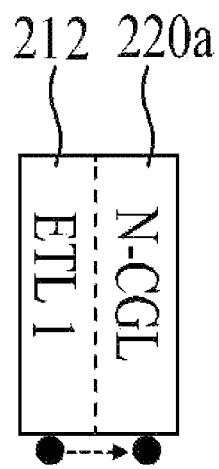
FIG. 3B is a diagram for explaining charge movement between a first electron transport layer and an N-type charge generation layer of the organic light emitting display device according to the first embodiment of the present invention.

In the first embodiment of the present invention, however, the N-CGL 220a and the ETL1 212 of the first stack 210 include the same electron transporting material and thus form a homo-junction as illustrated in FIG. 3B. Thus, in the first embodiment, the number of hetero-junction interfaces may be reduced and thus accumulation of charges at the energy barrier may be prevented. Accordingly, charges are smoothly transferred and thus charge trapping does not occur, which results in reduced driving voltage.

Figure 4:
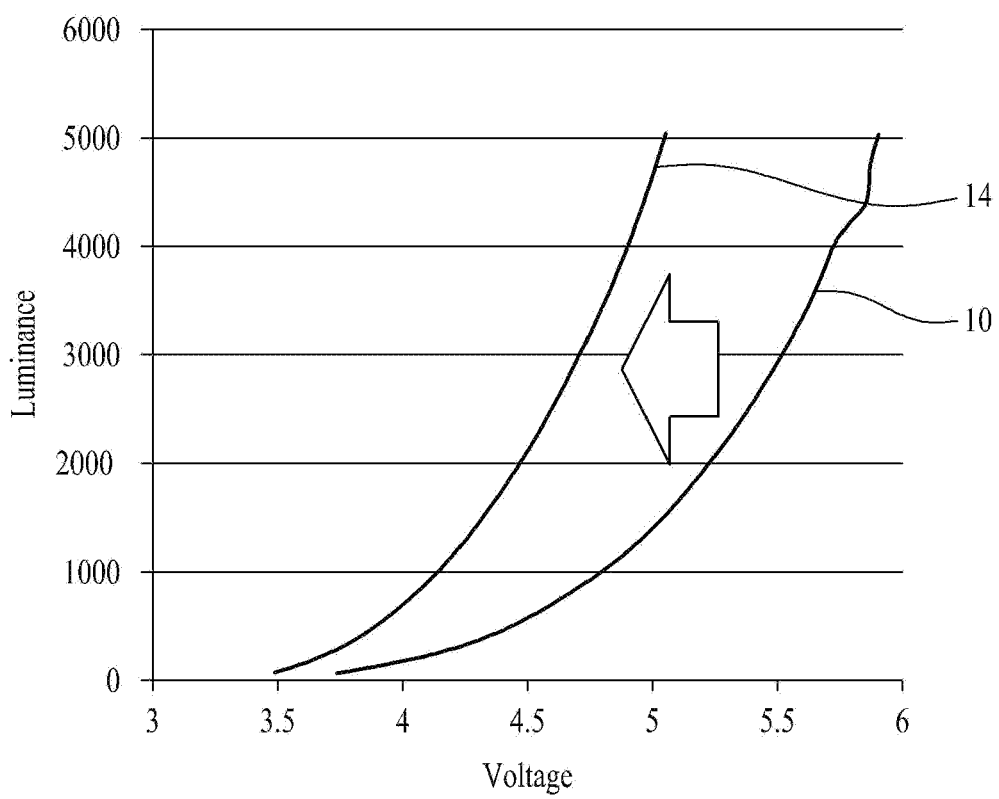
FIG. 4 is a graph showing comparison results between driving voltages of a conventional organic light emitting display device having a multi-stack structure and the organic light emitting display device having a multi-stack structure according to the first embodiment of the present invention.

In addition, as illustrated in FIG. 4, it can be confirmed that driving voltage is reduced using the N-CGL 220a including the same electron transporting material as that of the ETL1 212. FIG. 4 is a graph showing comparison results between driving voltages of a conventional OLED having a multi-stack structure and an OLED having a multi-stack structure according to the present invention.

In FIG. 4, a first graph 10 shows the driving voltage of the conventional OLED having a multi-stack structure. The conventional OLED having a multi-stack structure includes first and second electrodes and, on the first electrode, a first stack including an HTL, a first EML, and an ETL that are sequentially stacked, N-type and P-type CGLs, and a second stack including an HTL, a second EML, and an ETL that are sequentially stacked. That is, the first graph 10 shows a case in which the N-type CGL and the ETL are formed of different materials.

In FIG. 4, a second graph 14 shows the driving voltage of an OLED according to the present invention. In particular, the second graph 14 shows the driving voltage of an OLED including the ETL1 212 formed of an electron transporting material represented by Formula 1 below and the N-CGL 220a including the electron transporting material of Formula 1 and an organic compound represented by Formula 2 below.

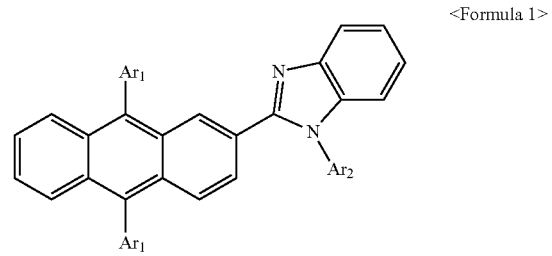

<Formula 1>

In Formula 1, Ar₁ and Ar₂ are each independently a substituted or unsubstituted heterocyclic group.

<Formula 2>

As illustrated in FIG. 4, it can be confirmed that the driving voltage is significantly lower in the second graph 14 than in the first graph 10. As such, charge trapping occurs at an interface between the N-type CGL and the ETL of the first stack of the conventional OLED, while the N-CGL 220a and the ETL1 212 of the OLED according to the first embodiment of the present invention include the same electron transporting materials and thus charge trapping does not occur, which results in decreased driving voltage.

In addition, as described above, the N-CGB 220a is doped with a metal and, as the metal, an alkali metal or an alkali earth metal is used. Examples of alkali metals and alkali earth metals include Ca, Li, Mg, Yb, and the like. In this regard, a doping amount of the alkali metal or the alkali earth metal is 1% to 10% based on the volume of the N-CGL 220a. As such, electrons generated from the P-CGL 220b are easily injected into the N-CGL 220a by doping the N-CGL 220a with an alkali metal 246 or an alkali earth metal. In other words, the alkali metal 246 or the alkali earth metal reacts with an N host to form an energy gap state, and the electrons generated from the P-CGL 220b are easily injected into the N-CGL 220a through the energy gap state.

Figure 5A:
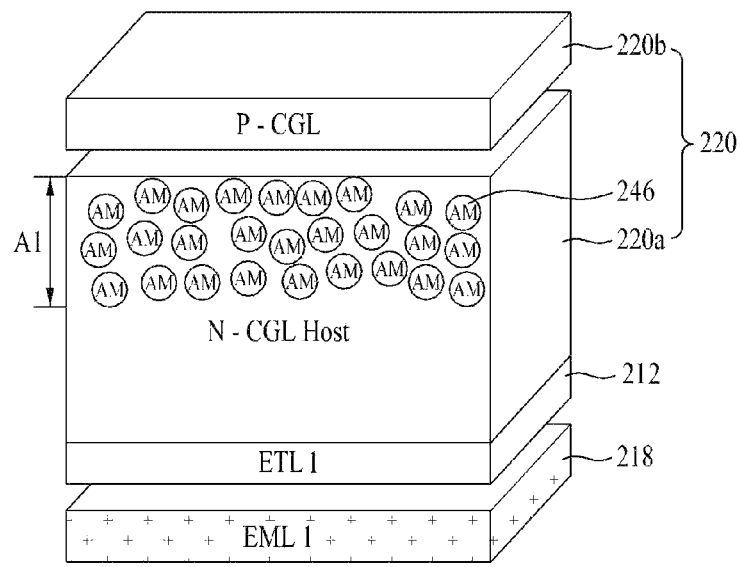
FIGS. 5A to 5D are views illustrating various examples of a case in which the N-type charge generation layer is doped with an alkali metal or an alkali earth metal.
Figure 5B:
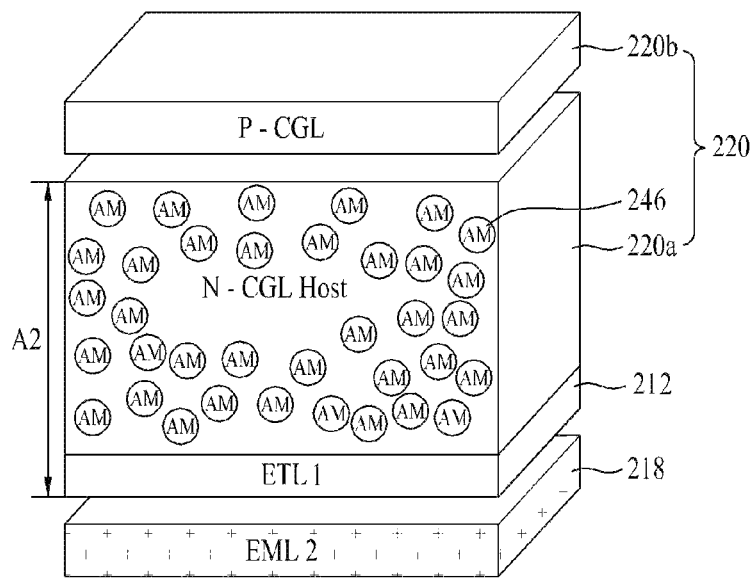
Figure 5C:
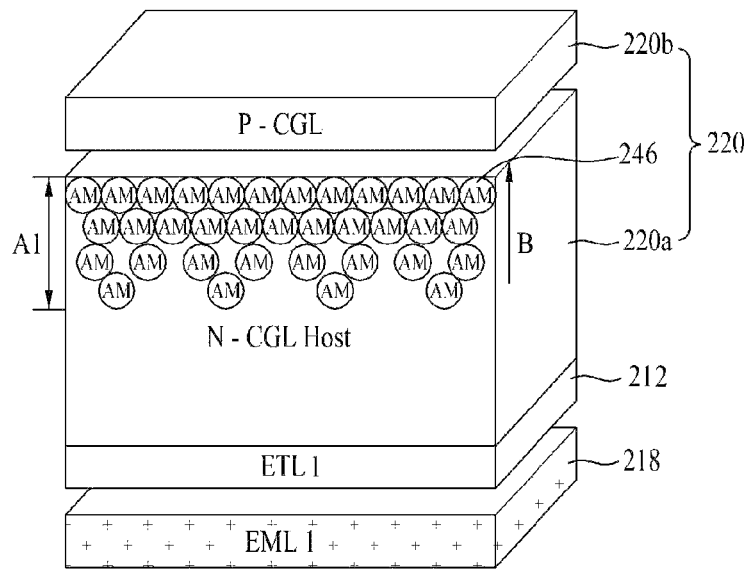
Figure 5D:
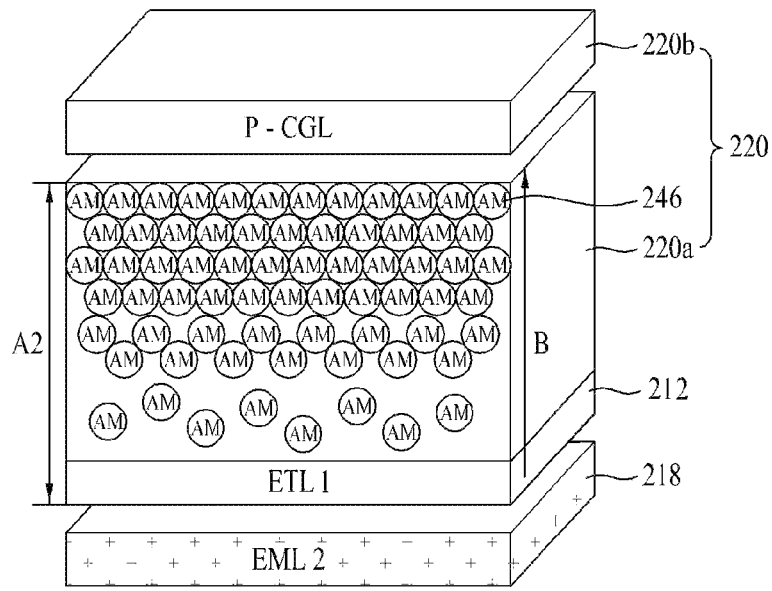

The alkali metal 246 or the alkali earth metal may be doped in a partial area A1 of the N-CGL 220a, as illustrated in FIG. 5A or may be doped in the entire area A2 of the N-CGL 220a, as illustrated in FIG. 5B. In addition, when only the partial area A1 of the N-CGL 220a is doped with the alkali metal 246 or the alkali earth metal, the doped partial area A1 may have a doping concentration gradient as illustrated in FIG. 5C. In this case, the doping concentration of the alkali metal 246 or the alkali earth metal may increase towards the P-CGL 220b. In addition, when the entire region A2 of the N-CGL 220a is doped with the alkali metal 246 or the alkali earth metal, as illustrated in FIG. 5D, doping may be performed by forming a doping concentration gradient of the alkali metal 246 or the alkali earth metal. In this case, the doping concentration of the alkali metal 246 or the alkali earth metal may increase towards the P-CGL 220b.

Figure 6:
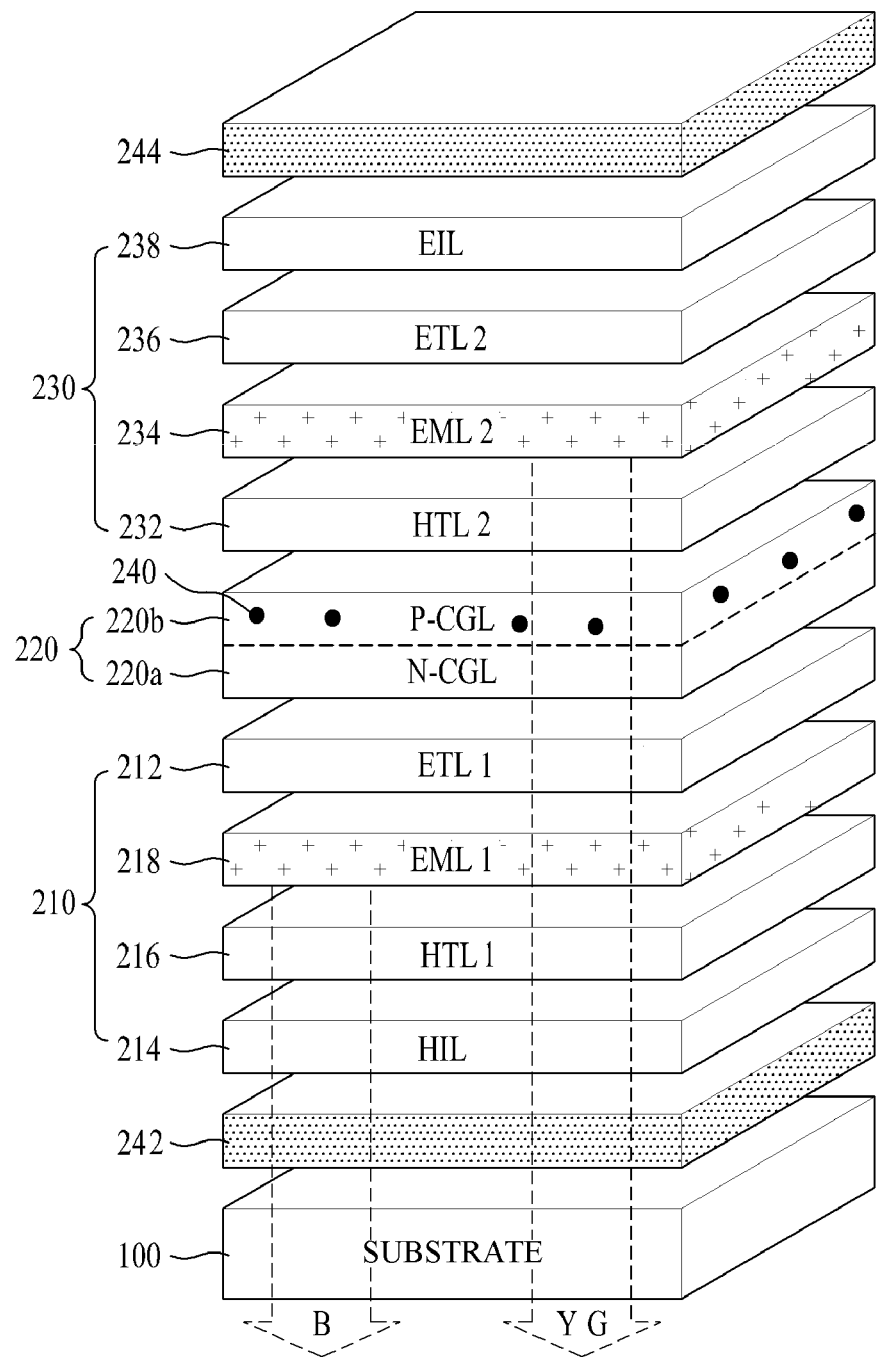
FIG. 6 is a view of an organic light emitting display device according to a second embodiment of the present invention.

FIG. 6 is a perspective view of an OLED according to a second embodiment of the present invention.

The OLED illustrated in FIG. 6 includes the same elements as those of the OLED illustrated in FIG. 2, except that an electron transporting material 240 is injected into the P-CGL 220b instead of the N-CGL 220a. Thus, a detailed description of the same elements will be omitted.

The P-CGL 220b generates holes and electrons, injects the generated holes into the HTL2 232 of the adjacent second stack 230, and injects the generated electrons into the N-CGL 220a.

The P-CGL 220b includes 5 to 40% of the electron transporting material 240 that is the same or different from that of the ETL1 212 of the first stack 210. The electron transporting material 240 included in the P-CGL 220b is doped in the P-CGL 220b or the P-CGL 240 is formed of the electron transporting material 240 and the organic material constituting the P-CGL 220b in combination.

For example, the P-CGL 220b is formed of an organic compound having 10 to 25 carbon atoms, a substituent of which has a cyano group. In particular, the organic compound of the P-CGL 220b has a LUMO energy level of −6.6 eV or more and a bandgap of 2.0 eV or more. Preferably, the organic compound has a LUMO energy level between −6.6 and −4.6 eV and a bandgap between 1.5 and 3.5 eV.

The electron transporting material 240 includes at least one nitrogen atom (N) and is formed of an organic compound having a heterocyclic ring with 5 to 30 carbon atoms. In particular, the electron transporting material has a LUMO energy level of −2.0 eV or less and a bandgap of 2.5 eV or more. Preferably, the electron transporting material has a LUMO energy level between −3.0 and −2.0 eV and a bandgap between 2.5 and 3.5 eV.

Figure 7:
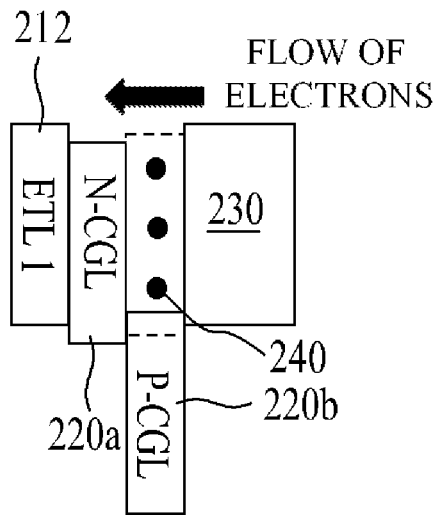
FIG. 7 is a diagram for explaining charge movement between a plurality of layers of the organic light emitting display device according to the second embodiment of the present invention.

Due to the electron transporting material 240 included in the P-CGL 220b, as illustrated in FIG. 7, flow of electrons in the P-CGL 220b is smooth because of a decreased difference between LUMO energy levels of the ETL1 212 and the N-CGL 220a. Accordingly, electrons generated in the P-CGL 220b rapidly move to the EML1 218 and thus driving voltage may be reduced, and generation of holes in the P-CGL 220b increases, whereby performance of the OLED may be enhanced.

Figure 8:
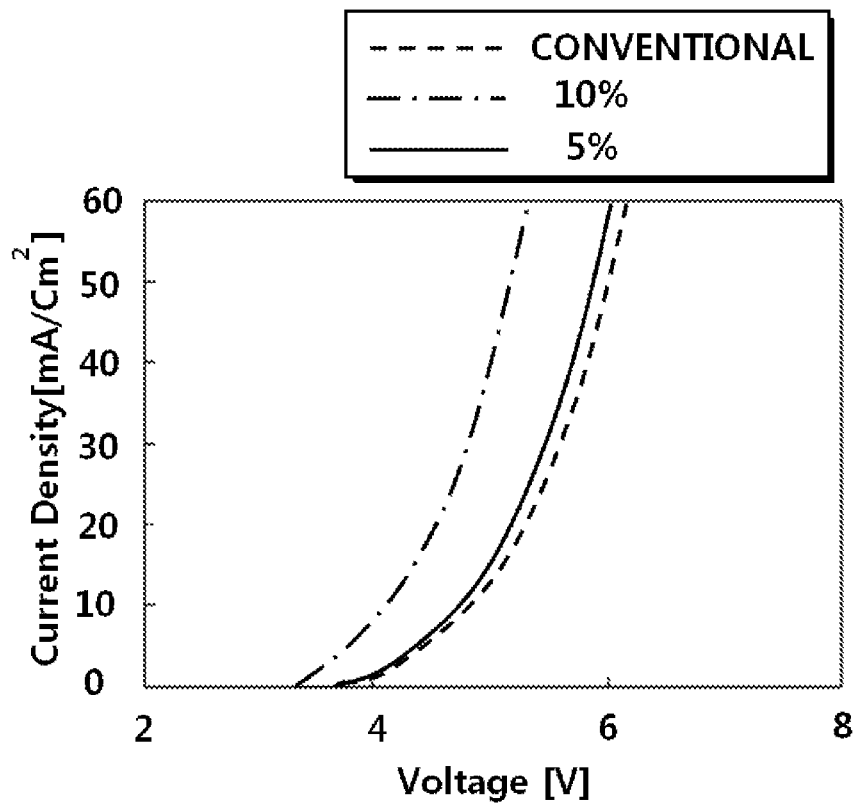
FIG. 8 is a graph showing comparison results between driving voltages of the conventional organic light emitting display device having a multi-stack structure and the organic light emitting display device having a multi-stack structure according to the second embodiment of the present invention.

FIG. 8 is a graph showing comparison results of driving voltages of a conventional OLED and the OLED according to the second embodiment of the present invention. With reference to FIG. 8, a case in which the P-CGL 220b of the OLED according to the second embodiment of the present invention includes the electron transporting material of Formula 1 and an organic compound represented by Formula 3 below will now be described by way of example.

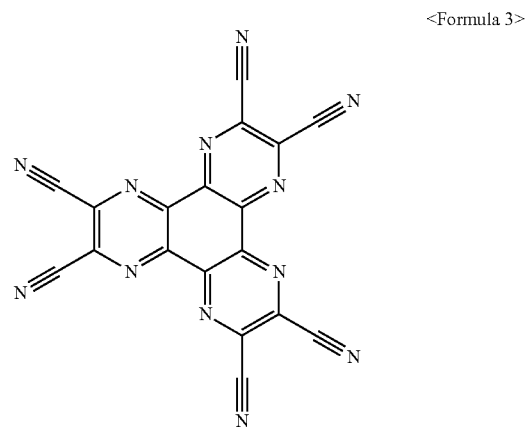 [SMILES: N#Cc1nc2c3nc(C#N)c(C#N)nc3c3nc(C#N)c(C#N)nc3c2nc1C#N]

<Formula 3>

As illustrated in FIG. 8, to obtain the same current density, the driving voltage of the conventional OLED including a P-CGL alone has to be higher than that of the OLEDs according to the second embodiment of the present invention including the P-CGL 220b including 5% of the electron transporting material 240 and the P-CGL 220b including 10% of the electron transporting material 240, respectively. As such, the OLED according to the second embodiment including the P-CGL 220b including the electron transporting material 240 has decreased driving voltage.

Figure 9:
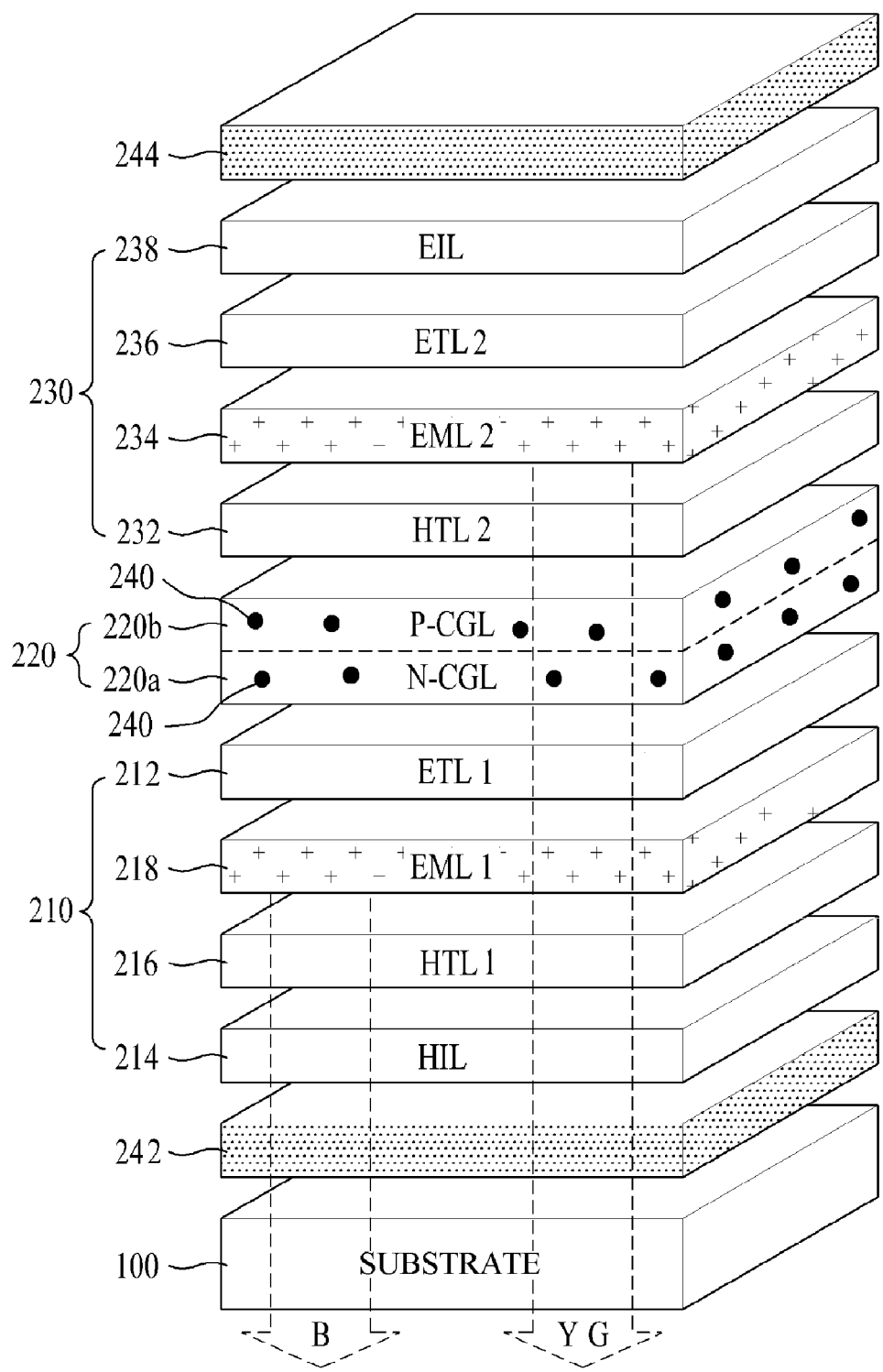
FIG. 9 is a view of an organic light emitting display device according to a third embodiment of the present invention.

FIG. 9 is a perspective view of an OLED according to a third embodiment of the present invention.

The OLED illustrated in FIG. 9 includes the same elements as those of the OLED illustrated in FIG. 2, except that the electron transporting material 240 is injected into the P-CGL 220b and the N-CGL 220a. Thus, a detailed description of the same elements will be omitted.

The P-CGL 220b generates holes and electrons, injects the generated holes into the HTL2 232 of the adjacent second stack 230, and injects the generated electrons into the N-CGL 220a.

The P-CGL 220b includes 5 to 40% of the electron transporting material 240 that is the same as that of the ETL1 212 of the first stack 210. The electron transporting material 240 included in the P-CGL 220b is doped in the P-CGL 220b or the P-CGL 240 is formed of the electron transporting material 240 and the organic material constituting the P-CGL 220b in combination.

For example, the P-CGL 220b is formed of an organic compound having 10 to 25 carbon atoms, a substituent of which has a cyano group. In particular, the organic compound of the P-CGL 220b has a LUMO energy level of −6.6 eV or more and a bandgap of 2.0 eV or more. Preferably, the organic compound has a LUMO energy level between −6.6 and −4.6 eV and a bandgap between 1.5 and 3.5 eV.

The electron transporting material 240 includes at least one nitrogen atom (N) and is formed of an organic compound having a heterocyclic ring with 5 to 30 carbon atoms. In particular, the electron transporting material 240 has a LUMO energy level of −2.0 eV or less and a bandgap of 2.5 eV or more. Preferably, the electron transporting material 240 has a LUMO energy level between −3.0 and −2.0 eV and a bandgap between 2.5 and 3.5 eV.

Figure 10:
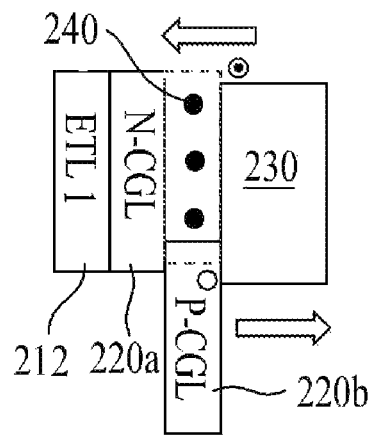
FIG. 10 is a diagram for explaining charge movement between a plurality of layers of the organic light emitting display device according to the third embodiment of the present invention.

Due to the electron transporting material 240 included in the P-CGL 220b, as illustrated in FIG. 10, flow of electrons in the P-CGL 220b is smooth because of a decreased difference between LUMO energy levels of the ETL1 212 and the N-CGL 220a. Accordingly, electrons generated in the P-CGL 220b rapidly move to the EML1 218 and thus driving voltage may be reduced, and generation of holes in the P-CGL 220b increases, whereby performance of the OLED may be enhanced.

The N-CGL 220a is formed between the P-CGL 220b and the EML1 218 and injects and transports electrons injected from the P-CGL 220b into the EML1 218. The N-CGL 220a includes an organic compound, the same electron transporting material as that of the ETL1 212, and a metal in combination.

The organic compound has a fused aromatic ring with 15 to 40 carbon atoms, a substituent of which has at least one selected from among N, S, and O. In particular, the organic compound has a LUMO energy level of −2.0 eV or less and a bandgap of 2.5 eV or more. Preferably, the organic compound has a LUMO energy level between −3.0 and −2.0 eV and a bandgap between 2.5 and 3.5 eV.

As the metal, an alkali metal or an alkali earth metal is used.

The electron transporting material includes at least one nitrogen atom (N) and is formed of an organic compound having a heterocyclic ring with 5 to 30 carbon atoms. In particular, the electron transporting material has a LUMO energy level of −2.0 eV or less and a bandgap of 2.5 eV or more. Preferably, the electron transporting material has a LUMO energy level between −3.0 and −2.0 eV and a bandgap between 2.5 and 3.5 eV.

Since the N-CGL 220a includes the electron transporting material, the ETL1 212 formed of the electron transporting material and the N-CGL 220a including the electron transporting material form a homo-junction. Accordingly, due to reduction in the number of hetero-junction interfaces, possibility of charge trapping at interfaces between hetero-junctions is minimized and thus driving voltage may be reduced and, accordingly, power consumption may be decreased.

Figure 11:
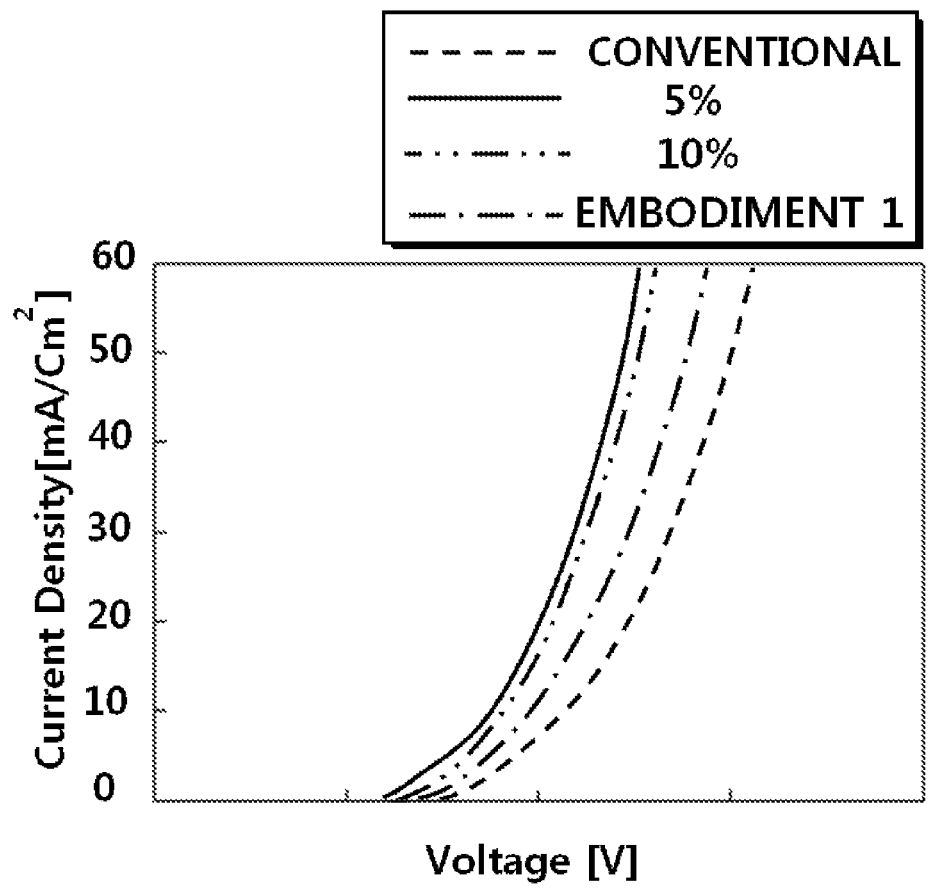
FIG. 11 is a graph showing comparison results between driving voltages of the conventional organic light emitting display device having a multi-stack structure and the organic light emitting display device having a multi-stack structure according to the third embodiment of the present invention.

FIG. 11 is a graph showing comparison results of driving voltages of a conventional OLED and the OLED according to the third embodiment of the present invention. With reference to FIG. 11, a case in which the P-CGL 220b of the OLED according to the third embodiment of the present invention includes the electron transporting material of Formula 1 and the organic compound of Formula 3 and the N-CGL 220a thereof includes the electron transporting material of Formula 1 and the organic compound of Formula 2 will now be described by way of example.

As illustrated in FIG. 11, to obtain the same current density, the driving voltage of the conventional OLED including a P-CGL alone has to be higher than that of the OLED according to the third embodiment of the present invention including the N-CGL 220a, the P-CGL 220b, and the ETL1 212 that include the same electron transporting material 240. As such, the OLED according to the third embodiment has lower driving voltage than that of the conventional OLED including the ETL1 212, the N-CGL 220a, and the P-CGL 220b that are formed of different materials.

Although the OLED according to each of the first, second and third embodiments of the present invention has a structure including two stacks, OLEDs according to embodiments of the present invention may also have a structure including at least three stacks.

In addition, in the structure including at least three stacks, an EML disposed between CGLs has a single-layer structure or a multi-layer structure. When the EML has a single-layered structure, the EML may include a single host and a single dopant or a plurality of hosts and dopants that have different colors.

Figure 12:
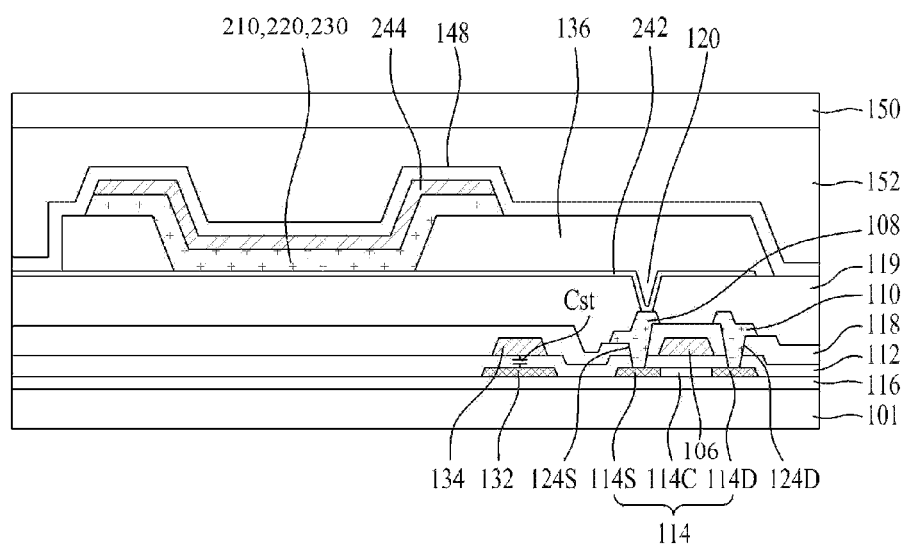
FIG. 12 is a sectional view illustrating the organic light emitting display device according to one of the first, second and third embodiments of the present invention including driving thin film transistors.

FIG. 12 is a sectional view of an organic light emitting display device including the OLEDs according to the first, second and third embodiments of the present invention.

As illustrated in FIG. 12, the organic light emitting display device includes a substrate 101 and an encapsulation substrate 150 adhered to the substrate 101 by an adhesive film 152.

The organic light emitting display device includes, on the substrate 101, a driving thin film transistor and an OLED connected to the driving thin film transistor.

The driving thin film transistor includes a buffer film 116, an active layer 114, and a gate electrode 106, on the substrate 101, and the gate electrode 106 is formed to correspond to a channel region 114C of the active layer 114, with a gate insulating film 112 disposed therebetween. Source and drain electrodes 108 and 110 are insulated from each other, with the gate electrode 106 and an interlayer insulating film 118 disposed therebetween. The source and drain electrodes 108 and 110 are respectively connected to source and drain regions 114S and 114D of the active layer 114 into which n+ impurities are injected, through a source contact hole 124S and a drain contact hole 124D, respectively that pass through the interlayer insulating film 118 and the gate insulating film 112. In addition, to reduce off-current, the active layer 114 may further include a lightly doped drain (LDD) region (not shown) with n− impurities injected thereinto, disposed between the channel region 114C and each of the source and drain regions 114S and 114D. In addition, a pixel protective film 119 formed of an organic insulating material is formed on the driving thin film transistor formed on the substrate 101. In another embodiment, the pixel protective film 119 on the driving thin film transistor may have a two-layer structure including an inorganic protective film formed of an inorganic insulating material and an organic protective film formed of an organic insulating material.

The OLED includes a first electrode 242 connected to the source electrode 108 of the driving thin film transistor via a pixel contact hole 120, a bank insulating film 136 having a bank hole to expose the first electrode 242, a plurality of stacks disposed on the first electrode 242 and including EMLs to emit particular light, a CGL formed between the stacks to adjust charge balance between the stacks, and a second electrode 244 formed on the stacks. In this regard, the OLED includes the same elements and has the same functions as those of the OLEDs according to the first, second and third embodiments of the present invention, which have been described above in detail.

A passivation film 148 is formed between the OLED and the adhesive film 152 to prevent damage to the OLED due to moisture, oxygen, or the like or deterioration in luminous properties. In particular, the passivation film 148 contacts the adhesive film 152 to prevent moisture, hydrogen, oxygen, and the like from permeating into the OLED from side and front surfaces thereof. The passivation film 148 may be an inorganic insulating film formed of $SiN_x$, $SiO_x$, or the like.

A storage capacitor Cst includes a storage lower electrode 132 and a storage upper electrode 134 that are doped with p+ or n+ impurities, with the gate insulating film 112 disposed therebetween. The storage capacitor Cst holds a data signal charged in the first electrode 242 until the next data signal is charged.

As is apparent from the foregoing description, a light emitting device according to the present invention and an organic light emitting display device including the same include the same electron transporting material as that of an ETL in at least one of an N-CGL adjacent to a first stack and a P-CGL. Accordingly, an OLED having a multi-stack structure has a decreased number of hetero-junction interfaces and thus has reduced driving voltage, which results in decreased power consumption.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
   first and second electrodes facing each other on a substrate;
   a plurality of stacks stacked between the first and second electrodes and each comprising an EML so as to emit particular light; and
   a charge generation layer between the stacks to adjust charge balance therebetween and comprising an N-type charge generation layer and a P-type charge generation layer,
   wherein the P-type charge generation layer or both of the N-type charge generation layer and the P-type charge generation layer comprises the same electron transporting material as that of an electron transport layer of one of the stacks that is adjacent to the N-type charge generation layer.

2. The light emitting device according to claim 1, wherein the P-type charge generation layer comprises about 5 to about 40% of the same electron transporting material as that of the electron transport layer.

3. The light emitting device according to claim 1, wherein the N-type charge generation layer comprises an alkali metal or alkali earth metal and the same electron transporting material as that of the electron transport layer, and the P-type charge generation layer comprises about 5% to about 40% of the same electron transporting material as that of the electron transport layer.

4. The light emitting device according to claim 3, wherein the alkali metal or alkali earth metal is doped in a partial area or entire area of the N-type charge generation layer at a concentration of 1% to 10% based on a volume of the N-type charge generation layer.

5. The light emitting device according to claim 4, wherein the partial area or entire area of the N-type charge generation layer has a doping concentration gradient of the alkali metal or alkali earth metal.

6. The light emitting device according to claim 5, wherein, when the partial area or entire area of the N-type charge generation layer is doped with the alkali metal or alkali earth metal, a doping concentration of the alkali metal or alkali earth metal increases towards the P-type charge generation layer.

7. The light emitting device according to claim 1, wherein the electron transporting material of the electron transport layer includes at least one nitrogen atom and is formed of an organic compound having a heterocyclic ring with five to thirty carbon atoms.

\* \* \* \* \*